United States Patent [19]
Higgins et al.

[11] Patent Number: 5,828,226
[45] Date of Patent: Oct. 27, 1998

[54] PROBE CARD ASSEMBLY FOR HIGH DENSITY INTEGRATED CIRCUITS

[75] Inventors: H. Dan Higgins; Rajiv Pandey, both of Chandler; Norman J. Armendariz, Phoenix; R. Dennis Bates, Gilbert, all of Ariz.

[73] Assignee: Cerprobe Corporation, Gilbert, Ariz.

[21] Appl. No.: 746,117

[22] Filed: Nov. 6, 1996

[51] Int. Cl.⁶ .................................................... G01R 1/073
[52] U.S. Cl. ........................... 324/762; 324/757; 324/761
[58] Field of Search ..................................... 324/754, 757, 324/761, 762

[56] References Cited

U.S. PATENT DOCUMENTS

| | | | |
|---|---|---|---|
| 4,899,099 | 2/1990 | Mendenhall et al. | 324/754 |
| 4,932,883 | 6/1990 | Hsia et al. | 439/66 |
| 5,172,050 | 12/1992 | Swapp | 324/762 |
| 5,534,784 | 7/1996 | Lum et al. | 324/757 |
| 5,625,298 | 4/1997 | Hirano et al. | 324/754 |
| 5,703,494 | 12/1997 | Sano | 324/761 |

*Primary Examiner*—Glenn W. Brown
*Attorney, Agent, or Firm*—Cahill, Sutton & Thomas P.L.C.

[57] ABSTRACT

A probe card assembly includes a probe card, an interposer and a probe array. The probe array includes a plurality of closely spaced pins, each pin includes a post and a beam, and each beam has a first end attached to the top of a post and a second end for contacting an integrated circuit. A bead on the second end of the beam assures that the free end of the beam will contact an IC first. For contacts on a grid, the beams extend diagonally relative to the rows and columns of the grid, enabling the beams to be longer. For contacts in a row on centers closer than the pins, two rows of pins straddle the contacts and the beams extend toward the contacts from opposite sides of the contacts. The probe array can be formed on the high density side of the interposer.

11 Claims, 3 Drawing Sheets

PROBE CARD ASSEMBLY FOR HIGH DENSITY INTEGRATED CIRCUITS

BACKGROUND OF THE INVENTION

This invention relates to an apparatus for testing integrated circuits and, in particular, to a probe card assembly for testing an integrated circuit (IC) at a plurality of very closely spaced locations simultaneously.

A plurality of ICs are formed together on a semiconductor wafer by a long sequence of processing steps.

Near the end of the sequence, but before the wafer is divided into a plurality of dies or chips, the wafer is probed or tested to determine which of the ICs is functioning as expected. Typically, ICs are tested under computer control by bringing a probe card into temporary electrical contact with a single IC and then electrically operating the IC. The ICs are tested at this point in the process because the cost of subsequent operations, such as wire bonding the IC to leads and packaging the die, is significant and initial runs of highly complex ICs may yield thirty percent, or fewer, good dies.

There are several difficulties associated with these tests. A first difficulty is making simultaneous, temporary, reliable, non-destructive, low resistance contact with all the contact areas to be tested.

Simultaneous contact with hundreds of contact pads requires that the ends of two hundred and fifty, or more, probes be exactly coplanar. Even if the probes are exactly co-planar, the IC under test may not have co-planar contact pads. A greater applied force usually provides a more reliable contact but a greater force can damage the die, i.e. active circuitry underlying a contact pad, or can deform a contact pad to the point that subsequent wire bonding or die attachment is impaired. A compromise of sorts is to provide a certain amount of compliance in the probes. This provides the added benefit of a "scrubbing" action that enables the probe to penetrate the non-conductive materials, e.g. oxides or contaminants, present on the exposed surfaces of the contact pads of an IC. The scrubbing, if not severe, provides good contact without damaging the contact pad.

A second difficulty is that, as ICs become more dense, i.e. have more components per unit area, the separation of the contact pads becomes smaller, making the contact mechanism progressively more delicate and separation more difficult. At present, probe cards include a plurality of needles arranged closely together in a peripheral layout, e.g. a hollow square. As the needles or pins of a probe become smaller, choices of materials for the pins become more limited. The conductivity of a small wire must be higher than the conductivity of a larger wire. A smaller wire must be relatively stiffer than a larger wire in order to maintain a controlled position. These parameters are independent and may eliminate many materials suitable for probes for lower density ICs.

Increased density also makes it more difficult to position the contact areas at the edges of the die. Five to eight rows of contacts is the maximum that can be reached with a plurality of pins using current technology, depending upon the density and configuration of the pads. The contact areas on an IC are typically arranged in an array resembling either a hollow square or a filled square.

It is desired that a probe have a filled array of pins, have at least fifteen pins per side, and that the pins be on 10 mil (0.25 mm) centers, or less. A probe array in the form of a filled square can be a "universal" probe in that not all of the pins need be used and a single probe array can match the contact pads on different ICs.

A third difficulty is that newer ICs operate at higher clock frequencies than their predecessors. The problem with a higher clock frequency is compounded by the fact that the signals in a digital circuit are square wave pulses, not sinusoidal signals. As shown by the mathematician Fourier, a square wave of a given frequency is the sum of a sine wave of the same frequency (the fundamental) and sine waves at the odd harmonics of the fundamental. Thus, the pulses for testing an IC contain components of significantly higher frequency than the nominal clock frequency. At high clock frequencies, e.g. above 25 megahertz, wires or conductive traces become transmission lines having complex, frequency dependent, impedance characteristics that can distort the test results.

A test station typically includes suitable mechanical apparatus for moving a probe card relative to a wafer, optical apparatus for manually or automatically aligning the probe card over each IC in sequence, and electronics for operating the IC once electrical contact is made. The test station may include a marker for physically marking defective ICs or the information on defects is simply stored with other data on each wafer.

A probe card assembly includes three regions, which may or may not correspond to separate physical devices. A first region is a probe card which carries the electrical signals for each contact pad on an IC by way of a separate wire or conductive trace. The probe card is a printed circuit board and is the interface to a computer for producing appropriate test signals and for sensing the response of the IC. A second region includes the probes themselves, which are typically a plurality of cantilever mounted pins having the free ends thereof pointing downward and carefully aligned with the ends of all the other pins to be in a single plane. A third region is the transition or interface between the low density probe card and the high density pins in a probe array.

The difficulties associated with pin-type probes are discussed in U.S. Pat. No. 4,899,099 (Mendenhall et al.), which discloses a "flex dot" probe card in which the probes and the transition region are formed on a polyimide film having copper traces thereon. The film is folded over a support member and the finely spaced ends of the traces are pressed against the contact pads of an IC by resilient pressure pads on the support member. While providing better control over the probes than cantilever mounted pins, the portions of the probe for each side of a die are separately positioned and are located by posts on the support member engaging holes in the film. Thus, a set of traces may be in a straight line but may not be exactly parallel to and coplanar with the traces for the opposite side of the IC.

U.S. Pat. No. 4,932,883 (Hsia et al.) discloses a probe card in which each probe includes a tab extending from a through-hole conductor and overlying an elastomer layer. The tab has a much larger area than the cross-sectional area of the conductor to facilitate locating the probe card relative to an IC for testing.

In view of the foregoing, it is therefore an object of the invention to provide an improved probe card assembly for high density ICs, e.g. ICs having a pin count in excess of three hundred.

Another object of the invention is to provide a probe array for testing ICs having contact pads on 10 mil (0.25 mm) centers or less.

A further object of the invention is to provide a probe array in which the pins are co-planar.

Another object of the invention is to provide a probe array in which the pins are slightly compliant.

A further object of the invention is to provide a probe array in which the pins can be arranged in a filled array of at least fifteen pins on each side.

Another object of the invention is to provide a probe array for testing ICs having either metal pads or solder bumps.

A further object of the invention is to provide a probe array for simultaneously testing more than one device.

SUMMARY OF THE INVENTION

The foregoing objects are achieved by this invention in which each pin in a probe array includes a post and a beam having a first end attached to the top of the post and a second end for contacting the test pad of an integrated circuit. The force applied to the free end of the beam causes the beam to bend, i.e. to flex without deformation, thereby accommodating variations in the height of the contacts on an IC. In accordance with another aspect of the invention, the beams are oriented for optimum access to the contacts. For a group of contacts located in a grid on an IC, the beams extend diagonally relative to the rows and columns in the grid, enabling the beams to be longer and more compliant. For contacts located not on a grid or for extremely dense contacts, the beams extend inwardly from opposite sides of the contacts, enabling contact on centers smaller than the center to center spacing of the beams. A probe card assembly includes a probe array, constructed as described above, coupled to a probe card by an interposer. The pins can be formed on the high density side of the interposer.

BRIEF DESCRIPTION OF THE DRAWINGS

A more complete understanding of the invention can be obtained by considering the following detailed description in conjunction with the accompanying drawings, in which:

FIGS. 5–14 illustrate a process for making pins for a probe array, in which FIG. 5 illustrates a metal coated substrate;

FIG. 6 illustrates a substrate after depositing and patterning a layer of photoresist and etching the metal layer;

FIG. 7 illustrates a substrate after depositing metal posts;

FIG. 8 illustrates a substrate after removing the photoresist;

FIG. 9 illustrates a substrate after depositing a sacrificial layer of metal;

FIG. 10 illustrates a substrate after planarizing the metal layer to expose the tops of the posts;

FIG. 11 illustrates a substrate after depositing and patterning another layer of photoresist;

FIG. 12 illustrates a substrate after depositing metal beams;

FIG. 13 illustrates a substrate after removing the photoresist;

FIG. 14 illustrates a substrate after removing the sacrificial layers;

DETAILED DESCRIPTION OF THE INVENTION

Figure 1:
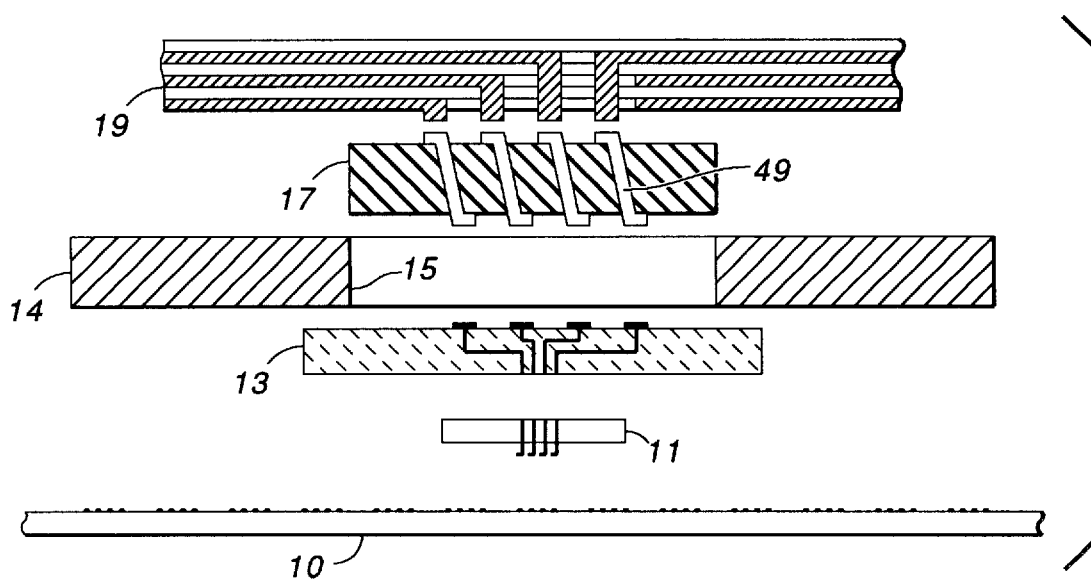
FIG. 1 illustrates a probe card assembly constructed in accordance with the invention.

FIG. 1 is an expanded view of a probe card assembly constructed in accordance with the invention in which probe array 11 is positioned over an integrated circuit, represented by a group of four dots, in wafer 10. Probe array 11 includes a plurality of closely spaced pins for making electrical connection to the integrated circuit. Probe array 11 is electrically connected to interposer 13 that converts the high density center-to-center spacing of the pins to a low density spacing. Interposer 13 is mechanically attached to support 14 by any suitable means (not shown). Support 14 includes hole 15 for receiving compliant interconnect 17. Interconnect 17 includes a plurality of slanted pins for providing a yielding connection between interposer 13 and printed circuit board 19. Compliant interconnect 17 enables interposer 13 to be adjusted to have probe array 11 exactly co-planar with wafer 10. Suitable adjustment mechanisms, such as set screws, are known per se in the art.

In operation, probe array 11 is made parallel with wafer 10, or at least parallel with the integrated circuit to be tested on wafer 10. The assembly is lowered or wafer 10 is raised to bring the pins into contact with the integrated circuit and the integrated circuit is electrically operated. In accordance with one aspect of the invention, each pin includes a post and beam construction that enables the pin to provide a small deflection, up to 0.5 mil. to accommodate any irregularities in the planarity of the contacts of each integrated circuit.

Figure 2:
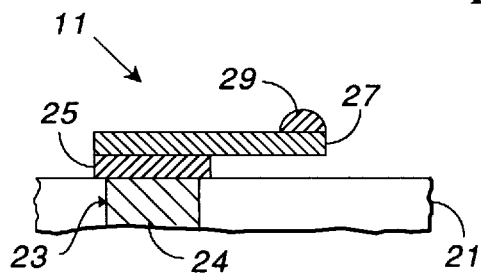
FIG. 2 is a cross-section of a pin constructed in accordance with the invention.

FIG. 2 illustrates the construction of the pins in accordance with the invention. Insulating substrate 21 is a multi-layer ceramic, an as-fired ceramic, or a multi-layer laminate and includes a plurality of holes, such as hole 23, filled with conductor 24, e.g. wires or electroplated copper. Post 25 is electroplated on top of conductor 24 and beam 27 is electroplated on top of post 25. Beam 27 is cantilever mounted on post 25; that is, one end of beam 27 is attached to the top of post 25 and the other end of beam 27 is unsupported. Thus constructed, beam 27 provides a slight compliance, e.g. 0.5 to 1.5 mil. A compliance of 0.5 mil. exceeds the variation in height of the contacts on an integrated circuit and even allows for a slight lack of parallel between probe array 11 and the integrated circuit.

In a preferred embodiment of the invention, post 25 has a diameter approximately five times its height and beam 27 has a length approximately ten times its thickness. In one embodiment of the invention, the posts had a diameter of five mils. and a height of one mil. and the beams had a length of ten mils and a thickness of one mil.

Also shown in FIG. 2 is optional bump 29 at the free end of beam 27. Bump 29, which is preferably hemispherical, assures that initial contact takes place at the free end of beam 27, thereby assuring a compliant connection. Bump 29 is preferably the same material as beam 27 but can be a harder metal or a softer metal instead. It is preferred that the metals used in implementing the invention be compatible with electro-plating processes, thereby simplifying the manufacture of probes constructed in accordance with the invention.

Alternatively, bump 29 can be formed using wirebond apparatus.

Figure 3:
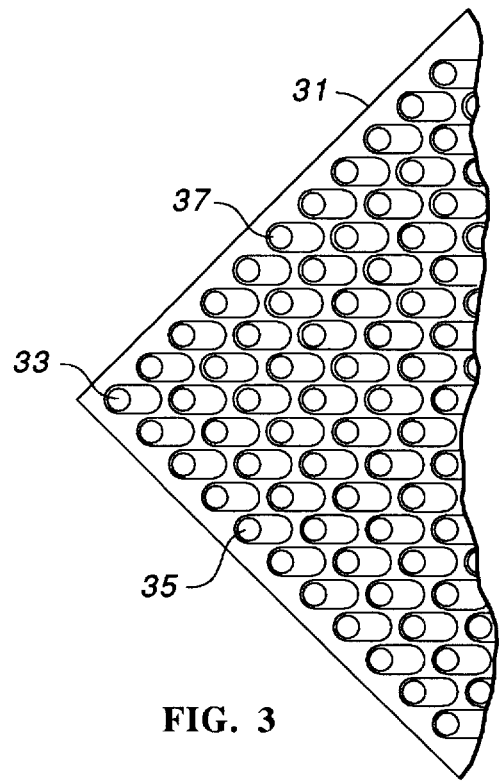
FIG. 3 illustrates a probe array constructed in accordance with another aspect of the invention.

FIG. 3 illustrates a portion of an 18×18 probe array having a plurality of pins constructed in accordance with one aspect of the invention and arranged in accordance with another aspect of the invention. Probe array 31 includes a plurality of pins having the beams arranged at an angle to the rows and columns of the array, thereby enabling as long a beam as possible to be fitted into a given array. In probe array 31, a first row of pins includes pins 33 and 35. A first column of pins includes pins 33 and 37. As illustrated in FIG. 3, the beams for each pin are arranged at an angle of approximately 45° to the rows and columns. This construction enables the beams to be approximately forty percent longer than if the beams were aligned with either a row or a column.

Figure 4:
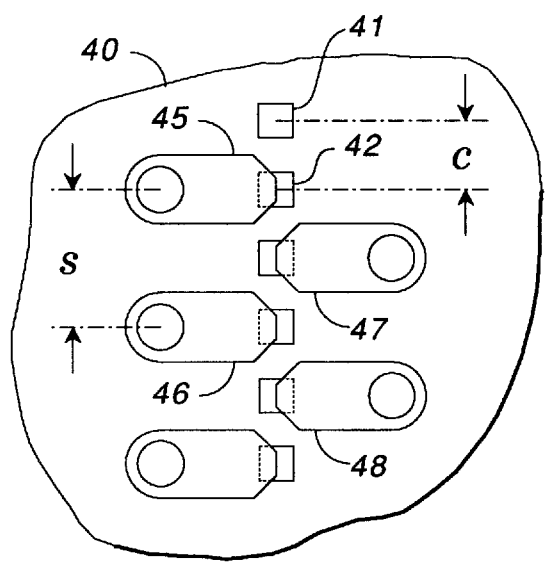
FIG. 4 is a plan view of a portion of an IC being probed by a plurality of pins having a center to center spacing greater than the spacing of the contacts.

The configuration illustrated in FIG. 3 assumes that the pins in an array are on a grid. Other geometries could be used to take advantage of different spacing. For example, as illustrated in FIG. 4, the pins are arranged to probe contact areas having a center to center spacing less than the spacing of the pins.

IC 40 includes a row of contacts, including contacts 41 and 42 having a center to center spacing c. A suitable probe array constructed in accordance with the invention includes a plurality of posts arranged in two rows straddling the row of contacts. Beams 45–48 extend toward the contacts from opposite sides of the contacts and the posts in each row have a center to center spacing s, where s>c or, more precisely, s=2c. The centers of one row of posts is offset from the centers of the other row of posts, enabling the free ends of the beams from one row to fit between the free ends of the beams in the opposite row, i.e. the free ends of the beams are slightly interleaved. The free ends of the beams can be tapered slightly, as illustrated in FIG. 4, to avoid shorts between the ends of the beams.

Returning to FIG. 1, interposer 13 preferably includes a multi-layer ceramic having a plurality of conductive traces fanning out from a high density pin spacing on the lower side of the interposer to a low density spacing on the upper side of the interposer. The conductive traces through the multi-layer ceramic are preferably copper or copper alloy and are terminated in a suitable pad or bump to assure reliable contact to probe array 11 and to compliant interconnect 17.

Compliant interconnect 17 preferably includes an elastomeric substrate having a plurality of angled pins therein, such as pin 49. As interconnect 17 is vertically compressed, the slight tilt to the pins provides a sideward motion enabling the structure to absorb the compression and to provide a slight scrubbing action as the ends of the pins move under compression. Interconnect 17 provides a larger amount of compliance than probe array 11. For example, an interconnect constructed as shown in FIG. 1 had a thickness of approximately 100 mils and a compliance of 30 mils.

FIGS. 5–14 illustrate a process for constructing pins in accordance with the invention. In the following description nickel is used as the contact metal and copper is used as a sacrificial metal. Other metals or alloys could be used instead.

Figure 5:
Figure 6:
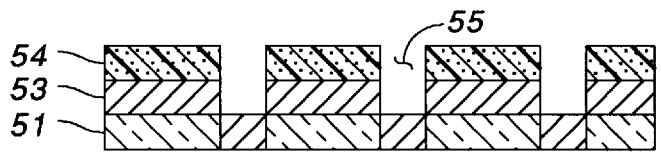
Figure 7:
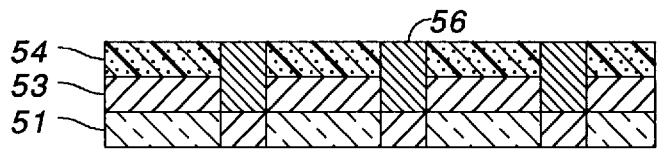
Figure 8:
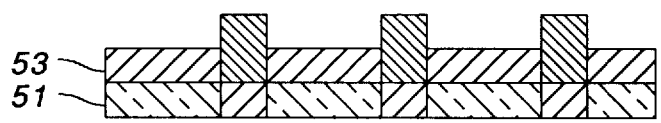
Figure 9:
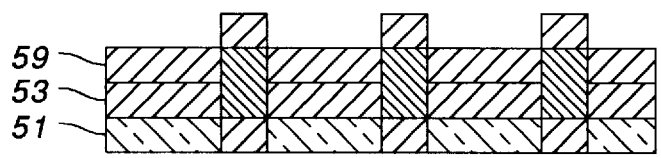
Figure 10:
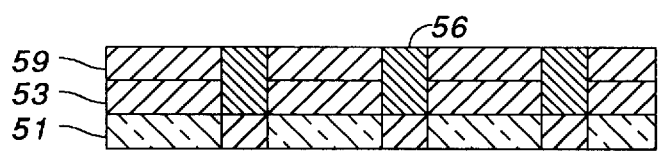

FIG. 5 illustrates insulating substrate 51 having a plurality of conductors extending from one major surface of the substrate to the other. Electroless copper layer 53 is deposited on substrate 51 in preparation for forming a plurality of pins. In FIG. 6, layer 54 of photoresist is applied and patterned to form a plurality of apertures such as aperture 55. Copper layer 53 is etched through the apertures to form vias. In FIG. 7, the vias are filled by electroplating nickel to form a plurality of posts, such as post 56. In FIG. 8, the photoresist layer has been removed, exposing a portion of the posts. In FIG. 9, copper layer 59 has been deposited to fill the area around each post. Some copper is also deposited on top of each post. In FIG. 10, the copper layer is planarized (polished) to assure that the upper ends of the posts are co-planar and that the nickel is exposed through copper layer 59. This completes the formation of the posts.

Figure 11:
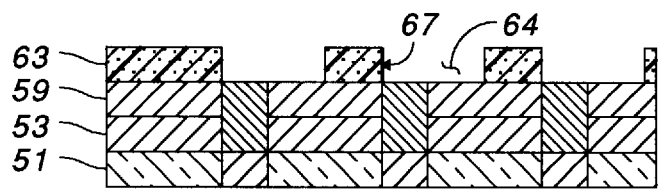

FIG. 11 illustrates the first step in forming the beams, in which photoresist layer 63 is applied to the probe array and patterned to form a plurality of apertures, such as aperture 64. The apertures in photoresist layer 54 (FIG. 6) determine the size and location of the posts. The apertures in photoresist layer 63 (FIG. 11) determine the location and orientation of the beams. Edge 67 of aperture 64 is approximately aligned with one edge of the underlying post and the other edge of the aperture overlies layer 59. Eccentrically locating the post within aperture 64 provides a cantilever mounted beam that, in turn, provides a compliant contact.

Figure 12:
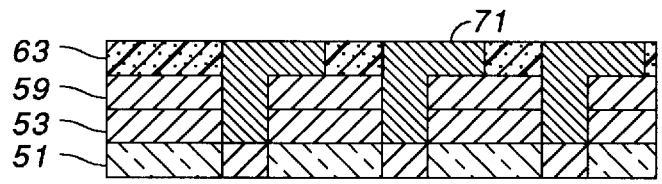
Figure 13:
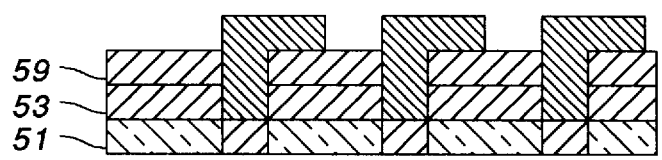
Figure 14:
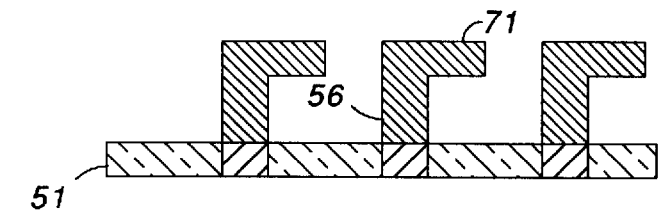

In FIG. 12, the apertures are filled by electroplating with nickel, thereby forming a plurality of beams such as beam 71. In FIG. 13, the photoresist is removed, exposing copper layer 59. Copper layer 59 and copper layer 53 are etched, as shown in FIG. 14, in a selective etch that removes the sacrificial copper but leaves the nickel. A heated (130° C.) solution of "Ultraetch 50" as sold by MacDermid, Inc. is suitable for this purpose. Other etchants are known in the art. The copper layers are removed, leaving a plurality of electrically isolated, nickel pins each including a post and a cantilever mounted beam.

Figure 15:
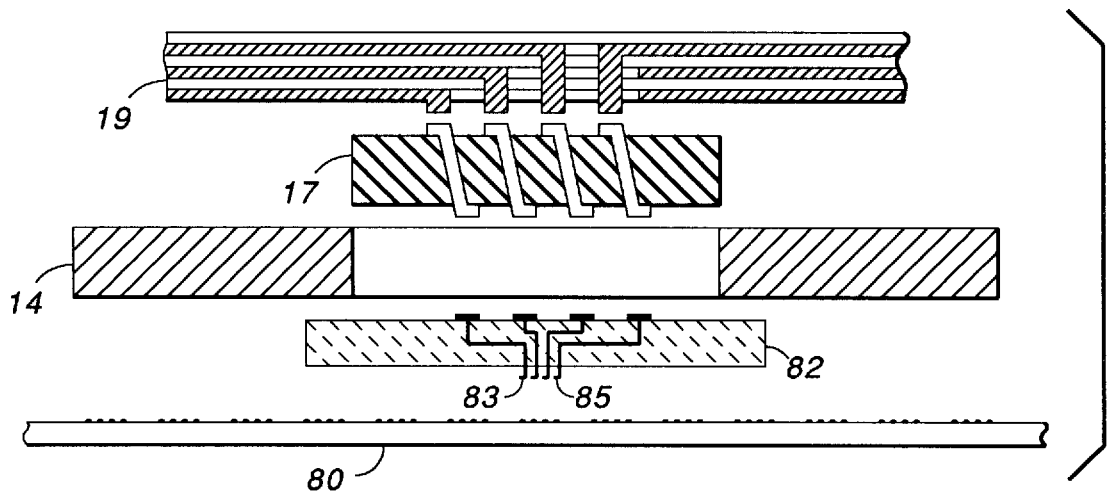
FIG. 15 illustrates a probe card assembly constructed in accordance with an alternative embodiment of the invention.

FIG. 15 illustrates a probe assembly constructed in accordance with an alternative embodiment of the invention wherein the pins are formed on the underside of the interposer. This construction eliminates one connection from the path between the probe card and the IC. At very high frequencies, each connection is potentially a discontinuity, an impedance mismatch. By eliminating a connection, the high frequency characteristics of the probe are improved.

Semiconductor wafer 80 includes a plurality of integrated circuits, each represented by a series of four dots. Interposer 82 includes a multi-layer ceramic having a low density pin spacing on one major surface thereof and a high density pin spacing on the opposite major surface thereof. High density pins 83 and 85 are formed on the underside of interposer 82 by electrolytic plating as described above. The posts and beams are preferably arranged as illustrated in FIG. 3 to provide as long a beam as possible within a given array.

Figure 16:
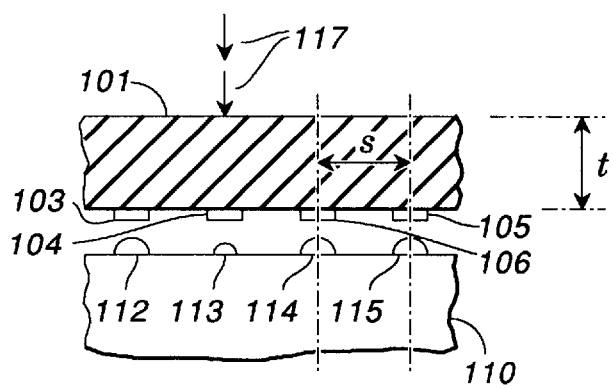
FIG. 16 illustrates a problem in the prior art with membrane probes.

The assemblies illustrated in FIGS. 1 and 15 are not the only types of probe card assemblies than can benefit from the invention. The post and beam construction can be used in conjunction with prior art systems to improve the performance thereof. For example, pins attached to a membrane, e.g. as described in the patent to Mendenhall et al., can benefit from the invention because the membrane, e.g. a thin polyimide sheet, is not really flexible on a microscopic level. As illustrated in FIG. 16, there is a difficulty with an array of high density probes on an insulating membrane. Specifically, if the membrane has a thickness t on the order of the center-to-center spacing s of the contacts, then it is very difficult to bend the membrane between adjacent contacts to accommodate uneven contacts.

In FIG. 16, insulating membrane 101 includes a plurality of contacts 103–106. Wafer 110 includes a plurality of contacts 112–115. If contact 113 is not co-planar with contacts 112 and 114, it is unlikely that membrane 101 can flex enough for contact 104 to touch contact 113. This is true even if t equaled five mils, s equaled ten mils, and a highly localized force, represented by arrows 117 could be applied to membrane 101 directly opposite contact 104. In practice, no such localized force is applied and a gap will remain between contact 104 and contact 113.

Figure 17:
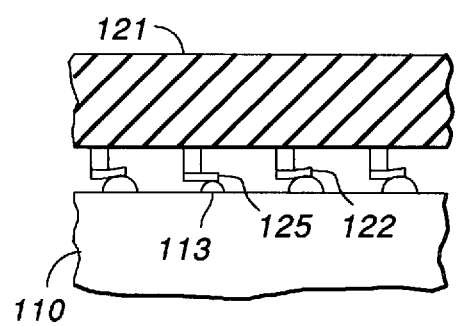
FIG. 17 illustrates how pins constructed in accordance with the invention overcome the problem with membrane probes.

As illustrated in FIG. 17, pins having a post and beam construction can accommodate slight irregularities in a wafer even when formed on a relatively rigid substrate. Applying a uniform force, that is, not a local force, to the upper surface of membrane 121 causes the beams of the contact to deflect, enabling beam 125 to touch contact 113. Thus, the invention is useful for rigid substrates and for flexible membranes.

The invention thus provides an improved probe card assembly for high density ICs having contact pads on 10 mil (0.25 mm) centers or less. The photolithography used in making the pins results in a probe card in which the pins are co-planar and are slightly compliant. The pins can be arranged in a filled array of at least fifteen pins on each side, enabling one to make a universal probe array.

Having thus described the invention, it will be apparent to those of skill in the art that various modifications can be made within the scope of the invention. For example, compliant interconnect 17 can include "fuzz buttons" instead of angled wires. A fuzz button is a fine, beryllium copper wire compressed longitudinally in a confined space, such as a capillary or small tube, to produce what looks like a tiny steel wool pad. The button provides a resilient connection. Although described in the context of a probe for an IC, i.e. for a single device, the invention can be used for simultaneously probing a plurality of devices on a wafer.

What is claimed as the invention is:

1. A probe card assembly for providing temporary electrical connections to a high density integrated circuit, said probe comprising:

a probe card including a plurality of conductive traces;

a plurality of pins in a high density array, wherein each pin includes a post and a cantilever mounted beam, said beam has a first end attached to the post and a second end for contacting said integrated circuit; and an interposer electrically connecting respective ones of said traces and said pins.

2. The probe card assembly as set forth in claim 1 wherein said array is solid.

3. The probe card assembly as set forth in claim 1 wherein said array is hollow.

4. The probe card assembly as set forth in claim 1 wherein the second end of each beam includes a bump for contacting said integrated circuit.

5. The probe card assembly as set forth in claim 1 wherein said array includes pins arranged in rows and columns and the beam of each pin extends diagonally relative to the rows and columns.

6. The probe card assembly as set forth in claim 1 and further comprising:

a flexible interconnect between said probe card and said interposer, said flexible interconnect enabling said interposer and said probe card to be positioned in intersecting planes.

7. The probe card assembly as set forth in claim 6 wherein said flexible interconnect includes a plurality of slanted pins in an elastomer sheet for providing a yielding connection between said interposer and said probe card.

8. The probe card assembly as set forth in claim 1 wherein said plurality of pins extends from a rigid, insulating substrate.

9. The probe card assembly as set forth in claim 1 wherein said plurality of pins extends from a flexible, insulating substrate.

10. The probe card assembly as set forth in claim 1 wherein said array includes pins arranged in rows and columns and the beams of the pins in one column extend toward the beams of the pins in an adjacent column.

11. The probe card assembly as set forth in claim 10 wherein the beams in adjacent columns are interleaved.

* * * * *